(12) United States Patent
Mehrad et al.

(10) Patent No.: US 7,960,280 B2
(45) Date of Patent: Jun. 14, 2011

(54) PROCESS METHOD TO FULLY SALICIDE (FUSI) BOTH N-POLY AND P-POLY ON A CMOS FLOW

(75) Inventors: Freidoon Mehrad, Plano, TX (US); Frank S. Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 606 days.

(21) Appl. No.: 11/844,832

(22) Filed: Aug. 24, 2007

(65) Prior Publication Data

US 2009/0050976 A1  Feb. 26, 2009

(51) Int. Cl.
  *H01L 21/44* (2006.01)
(52) U.S. Cl. ........ 438/655; 438/197; 438/233; 438/664; 257/E21.199; 257/E21.438; 257/E21.622
(58) Field of Classification Search .................. 438/218, 438/630, 651, 229; 257/E21.164, E21.296, 257/E21.439, E21.622
See application file for complete search history.

(56) References Cited

U.S. PATENT DOCUMENTS

| | | | |
|---|---|---|---|
| 5,953,612 A * | 9/1999 | Lin et al. ................ | 438/299 |
| 6,555,453 B1 | 4/2003 | Xiang et al. | |
| 7,229,871 B2 | 6/2007 | Yu et al. | |
| 7,235,472 B2 | 6/2007 | Klee et al. | |
| 7,253,049 B2 | 8/2007 | Lu et al. | |
| 2005/0074932 A1* | 4/2005 | Lin et al. ................ | 438/199 |
| 2005/0156208 A1* | 7/2005 | Lin et al. ................ | 257/288 |
| 2006/0134844 A1* | 6/2006 | Lu et al. ................ | 438/199 |
| 2009/0001588 A1* | 1/2009 | Ranade ................ | 257/757 |

* cited by examiner

*Primary Examiner* — Cheung Lee
(74) *Attorney, Agent, or Firm* — Warren L. Franz; Wade J. Brady, III; Frederick J. Telecky, Jr.

(57) ABSTRACT

An improved method of forming a fully silicided (FUSI) gate in both NMOS and PMOS transistors of the same MOS device is disclosed. In one example, the method comprises forming a first silicide in at least a top portion of a gate electrode of the PMOS devices and not over the NMOS devices. The method further comprises concurrently forming a second silicide in at least a top portion of a gate electrode of both the NMOS and PMOS devices, and forming a FUSI gate silicide of the gate electrodes. In one embodiment, the thickness of the second silicide is greater than the first silicide by an amount which compensates for a difference in the rates of silicide formation between the NMOS and PMOS devices.

21 Claims, 9 Drawing Sheets

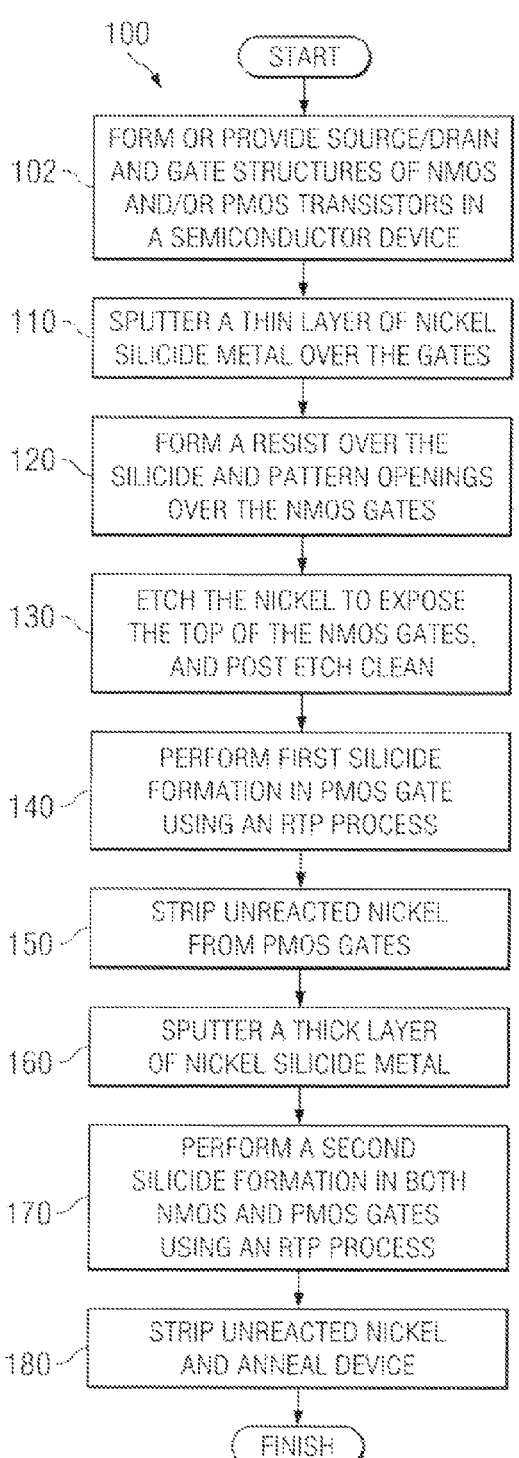
FIG. 2A
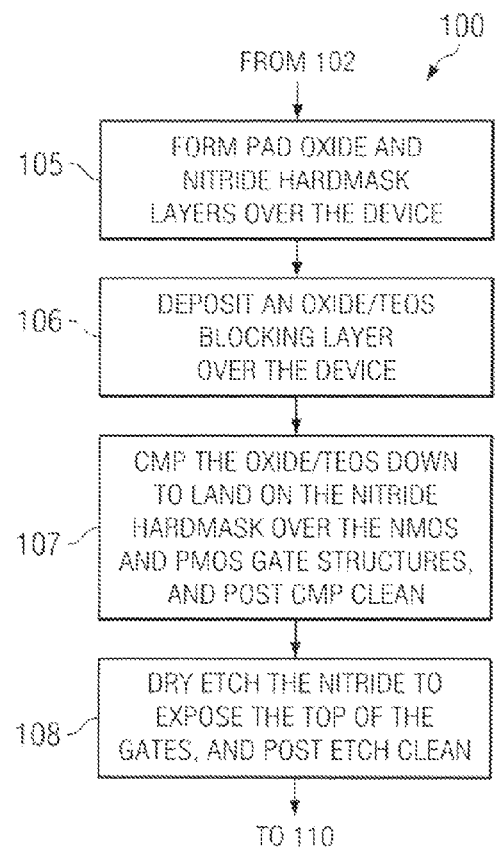
FIG. 2B
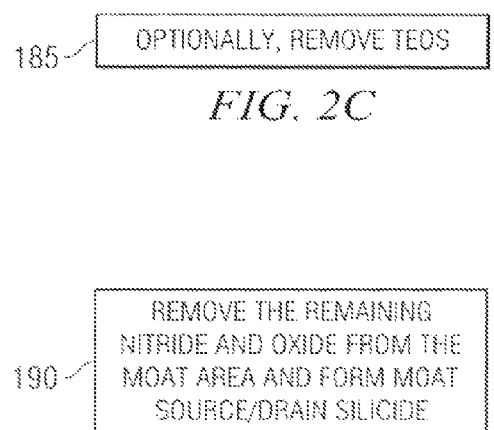
FIG. 2C
FIG. 2D

US 7,960,280 B2

PROCESS METHOD TO FULLY SALICIDE (FUSI) BOTH N-POLY AND P-POLY ON A CMOS FLOW

FIELD OF INVENTION

The present invention relates generally to semiconductor devices and more particularly to an innovative method of fabricating fully salicide (FUSI) poly gates of both PMOS and NMOS transistor devices of a CMOS process in a manner that provides a more evenly matched silicidation between the NMOS and PMOS transistor types of the same device.

BACKGROUND OF THE INVENTION

It can be appreciated that several trends presently exist in the electronics industry. Devices are continually getting smaller, faster and requiring less power, while simultaneously being able to support and perform a greater number of increasingly complex and sophisticated functions. One reason for these trends is an ever increasing demand for small, portable and multifunctional electronic devices such as cellular phones, personal computing devices, and personal sound systems are devices which are in great demand in the consumer market.

Accordingly, there is a continuing trend in the semiconductor industry to manufacture integrated circuits (ICs) with higher device densities by scaling down dimensions (e.g., at submicron levels) on semiconductor wafers. To accomplish such high densities, smaller feature sizes, smaller separations between features and layers, and/or more precise feature shapes are required, such as metal interconnects or leads, for example. The scaling-down of integrated circuit dimensions can facilitate faster circuit performance and/or switching speeds, and can lead to higher effective yield in IC fabrication processes by providing or 'packing' more circuits on a semiconductor die and/or more die per semiconductor wafer, for example.

One way to increase packing densities is to decrease the thickness of transistor gate dielectrics to shrink the overall dimensions of transistors used in IC's and electronic devices. Transistor gate dielectrics (e.g., silicon dioxide or nitrided silicon dioxide) have recently been reduced considerably to reduce transistor sizes and facilitate improved performance. Thinning gate dielectrics can have certain drawbacks, however. For example, a polycrystalline silicon ("polysilicon") gate overlies the thin gate dielectric, and polysilicon naturally includes a depletion region where it interfaces with the gate dielectric. This depletion region can provide an insulative effect rather than conductive behavior, which is desired of the polysilicon gate since the gate is to act as an electrode for the transistor.

By way of example, if the depletion region acts like a 0.8 nm thick insulator and the gate dielectric is 10-nm thick, then the depletion region effectively increases the overall insulation between the gate and an underlying transistor channel by eight percent (e.g., from 10 nm to 10.8 nm). It can be appreciated that as the thickness of gate dielectrics are reduced, the effect of the depletion region can have a greater impact on dielectric behavior. For example, if the thickness of the gate dielectric is reduced to 2 nm, the depletion region would effectively increase the gate insulator by about 40 percent (e.g., from 2 nm to 2.8 nm). This increased percentage significantly reduces the benefits otherwise provided by thinner gate dielectrics.

Metal gates can be used to mitigate adverse effects associated with the depletion region phenomenon because, unlike polysilicon, little to no depletion region manifests in metal. Interestingly enough, metal gates were commonly used prior to the more recent use of polysilicon gates. An inherent limitation of such metal gates, however, led to the use of polysilicon gates. In particular, the use of a single work function metal proved to be a limitation in high performance circuits that require dual work function electrodes for low power consumption. The work function is the energy required to move an electron from the Fermi level to the vacuum level, in modern CMOS circuits, for example, both p-channel MOS transistor devices ("PMOS") and n-channel MOS transistor devices ("NMOS") are generally required in the same device, where a PMOS transistor requires a work function on the order of 5 eV and an NMOS transistor requires a work function on the order of 4 eV. A single metal can not be used, however, to produce a metal gate that provides such different work functions. Polysilicon gates are suited for application in CMOS devices since some of the gates can be substitutionally doped in a first manner to achieve the desired work function for PMOS transistors and other gates can be substitutionally doped in a second manner to achieve the desired work function for NMOS transistors. However, polysilicon gates suffer from the aforementioned gate depletion.

Fully silicided (FUSI) gates eliminate the problem of polysilicon depletion. FUSI gates also increase the gate conductance (lower resistance) that can further improve device performance. A FUSI gate can be formed by depositing a metal layer (e.g., Ni, Ti, Co, Pt, W) over an exposed polysilicon gate region, pre-annealing (e.g., a rapid thermal process, RTP) to provide the required diffusion of the metal info the polysilicon, removing the unreacted metal, and then annealing the semiconductor structure to form a more stable silicide alloy phase. The deposited metal reacts with the exposed polysilicon gate to transform the polysilicon gate fully into a silicided gate. Preferably, the FUSI gate structure is then topped off with a low resistance contact.

The FUSI gate silicide is produced by an interaction between the diffused metal and silicon or polysilicon to produce a metal-silicon alloy such as NiSi. The process of forming a silicide is known as silicidation, and generally includes some type of heat treatment (e.g., annealing, sintering) to cause the metal and silicon to react with one another and form the more stable silicide alloy phase. Silicides generally have a low resistivity and thus perform well as gate contacts in transistors. A "silicide" is a self-aligned silicide formed atop a silicon gate. The silicide is said to be self-aligned, or a salicide, because it only reacts with the underlying silicon gate structure and thus does not generally extend off onto other structures, such as insulative sidewall spacers.

FUSI gates normally have a work function near the middle of the silicon bend structure. However, CMOS devices normally require a conductive gate with a work function near the band edge; i.e., near the conduction band for an NMOS device and near the valence band for a PMOS device, respectively. Thus, for CMOS technologies with FUSI gates, the different work functions required for each of the NMOS and PMOS portions of the CMOS device present a fabrication challenge as both types are usually required in the same device and may also require different dopant species in the doping process.

In addition, the silicide typically forms at different rates in the NMOS and PMOS devices to the point where it may be difficult to obtain a controllable or stable silicidation process. Because of these differing formation rates and the instability of the conventional process, the gate silicide formation occurring in a PMOS transistor may be yet incomplete, while an NMOS type transistor in the same device may have excessively formed and punched through the gate oxide layer.

Consequently, it would be desirable to be able to provide a more evenly matched formation of a fully silicided gate in both NMOS and PMOS regions of the same MOS device.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to an improved method of forming a fully silicided (FUSI) gate in both NMOS and PMOS transistor regions of the same MOS device such that the formations are more evenly matched between the NMOS and PMOS devices. In one embodiment, source/drain (S/D) and gate structures of NMOS and/or PMOS transistors are provided in a device such as a semiconductor device. Initially, the device may be planarized, such as by a chemical mechanical polishing (CMP) process down to land on, for example, a hardmask over the NMOS and/or PMOS gate structures, and the device may be post CMP cleaned. The hardmask may then be etched such as by a dry etch to expose the top of the gate, which is then post etch cleaned.

A first thin layer (e.g., about 200-300 Angstroms) of silicide metal (e.g., Ni, Ti, Co, Pt, W) is then deposited, such as by sputtering, over the exposed polysilicon of the gates. A resist is then formed over the silicide metal and openings are patterned over the NMOS gates. The silicide metal is then etched to expose the top of the NMOS gates, and the device is post-etch cleaned. A preannealing (e.g., a rapid thermal process, RTP) is then used to cause the silicide metal to diffuse down info the polysilicon gates of the PMOS devices in a first silicide formation. The unreacted metal is then striped from the PMOS devices.

A second thicker layer (e.g., about 800-1000 Angstroms) of silicide metal (e.g., Ni, Ti, Co, Pt, W) is then again deposited, such as by sputtering, over the exposed polysilicon of the gates. A second preannealing (e.g., a rapid thermal process, RTP) is then again used to cause the second thicker layer of silicide metal to diffuse down into the polysilicon gates of both the NMOS and PMOS devices in a second silicide formation. The unreacted metal is then striped from the NMOS and PMOS devices, and the devices are annealed to fully form the more stable silicide alloy phase of the FUSI gates.

In one embodiment, any remaining oxide barrier may then be removed and the all the blocking layer (oxide or TEOS) from the fop of the hardmask (e.g., nitride hardmask) on the moat, for example, using a hydrofluoric acid (HF) rinse, and a dry etch may be used thereafter to remove the nitride from the moat areas. Optionally thereafter, the remaining etch-stop such as an oxide and nitride may be removed from the moat area to allow formation of a subsequent source/drain silicide.

In accordance with one aspect of the invention, the method comprises forming a first silicide in at least a top portion of a gate electrode of the PMOS devices and not over the NMOS devices. The method further comprises concurrently forming a second silicide in at least a top portion of a gate electrode of both the NMOS and PMOS devices, and annealing to form a FUSI gate silicide of the gate electrodes.

In accordance with another aspect, the thickness of the second silicide metal layer and the resultant second silicide is greater than the first silicide metal layer and the resultant first silicide by an amount which compensates for a difference in the rates of silicide formation between the NMOS and PMOS devices.

Thus, the method provides a more evenly matched FUSI gate formation in both NMOS and PMOS transistor regions of the same CMOS device. In addition, the method still permits the use of one or more metal species to be deposited, sputtered, or implanted, and one or more annealing operations per silicide formation. The separate PMOS first silicidation and concurrent NMOS and PMOS second silicidation method of the present invention permits the NMOS and PMOS gate silicidations to be formed to about the same extent, and also aids in the adjustment and balancing of the work functions by providing a nickel-rich FUSI gate (not a poly gate) for the PMOS device earlier in the FUSI formation process. In addition, the FUSI gates of the transistors allow device dimensions, such as gate dielectric thicknesses, for example, to be reduced to facilitate increased packing densities, because there is less concern for gate oxide punch-through as with conventional methods. Additionally, the transistors can be efficiently formed as part of a CMOS fabrication process.

In accordance with another aspect, the work functions of the NMOS and PMOS devices may be adjusted by a combination of adding differing dopants prior to the first and second silicide formations, and by adjusting the relative thicknesses of the first and second silicide metal layers used to form the first and second silicides, respectively.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 2A-2D are flow diagrams illustrating one or more exemplary methodologies for forming an exemplary FUSI gate transistor in both NMOS and PMOS transistors of a device according to one or more aspects of the present invention.

DETAILED DESCRIPTION OF THE INVENTION

Figure 1A:
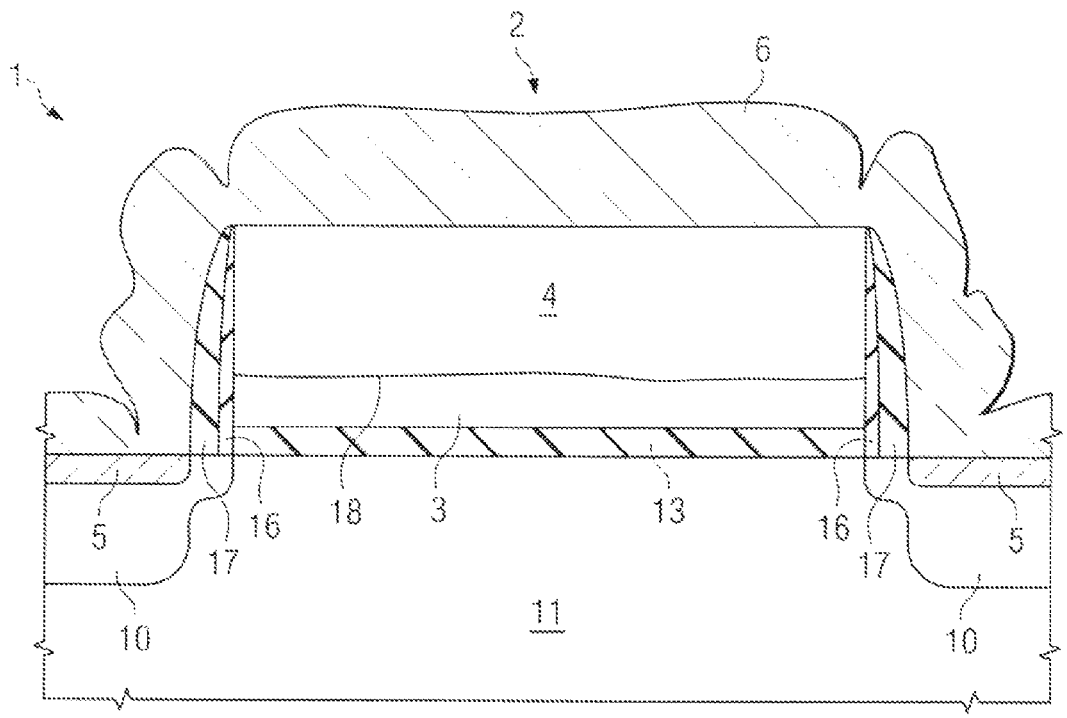
FIGS. 1A and 1B are fragmentary cross sectional diagrams illustrating problems in the conventional formation of an exemplary FUSI gate transistor, and forming a silicide concurrently in both NMOS and PMOS transistors of the same device.

One or more aspects of the present invention are described with reference to the drawings, wherein like reference numerals are generally utilized to refer to like elements throughout, and wherein the various structures are not necessarily drawn to scale, it will be appreciated that where like acts, events, elements, layers, structures, etc. are reproduced; subsequent (redundant) discussions of the same may be omitted for the sake of brevity, in the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, known structures are shown in diagrammatic form in order to facilitate describing one or more aspects of the present invention.

Figure 1B:
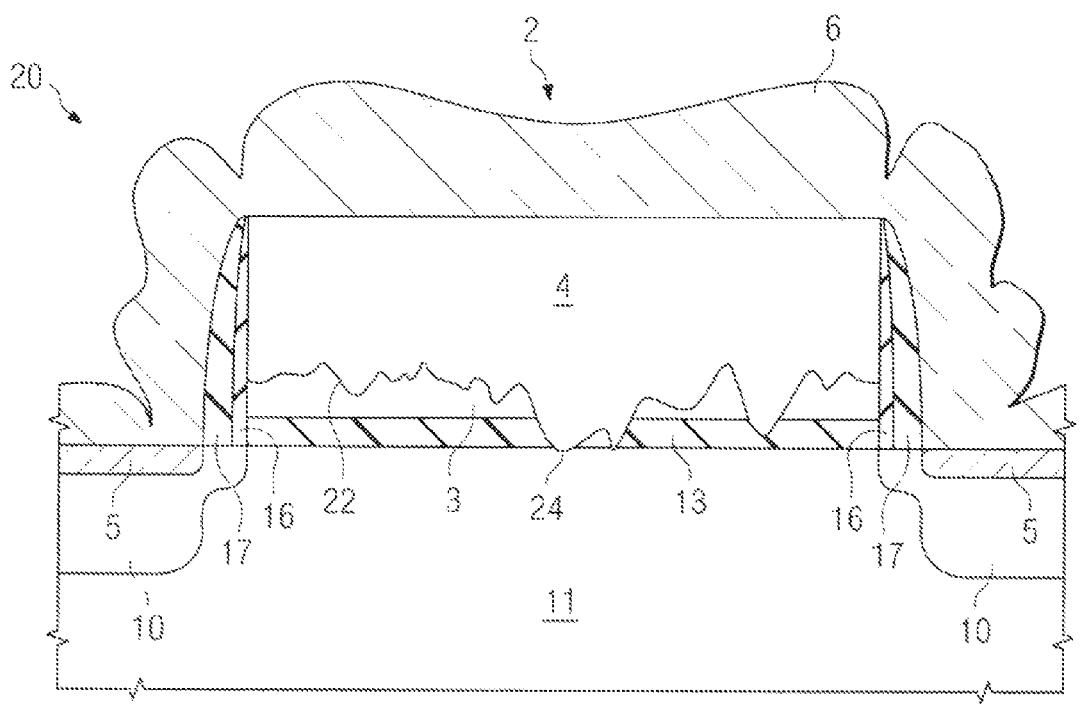

Turning to FIGS. 1A and 1B, a problem is illustrated in the conventional formation of an exemplary FUSI gate transistor 1 and 20 of PMOS and NMOS transistors, respectively, of the same device such as may be fabricated in accordance with one or more aspects of the method of the present invention. For example, transistors 1 and 20 of FIGS. 1A and 1B, respectively, comprise a fully silicided (FUSI) gate 2 formed over source/drain (S/D) regions 10 formed within a semiconductor substrate 11. Conventionally the FUSI gate 2 comprises a gate oxide (e.g., GOX, NO, PNO, RPNO, or ONO) 13 formed overlying the substrate 11. The FUSI gate 2 also comprises a silicon-containing gate material 3 such as a polysilicon gate material 3 which is silicided by the addition of a gate silicide metal 6 such as Ni, Co, Ti, Pt, and W, for example, over the silicon-containing gate material 3, and forming a gate silicide 4 such as an NiSi alloy in a portion of the FUSI gate 2. The gate silicide metal 6 may be added, for example, using a deposition, sputtering, or ion implantation process.

In a similar manner, an S/D silicide 5 is formed in the source/drain regions 10 by silicidation of the exposed polysilicon of the substrate 11 using an S/D silicide metal. Offset spacers (OS) 16 and side-wall spacers (SWS) 17, initially used to implant dopants into the source/drain regions 10, may also be subsequently used to guide the formation of the S/D silicidation 5, for example, using a deposition, sputtering, or ion implantation process. The gate silicide metal 6 and the S/D silicide metal may be the same metal or different metals or contain other dopant species.

FIGS. 1A and 1B also illustrates that a significant difference in the formation rates and formation characteristics between PMOS transistor 1 and NMOS transistor 20, particularly when these two types are formed concurrently in the same device. That is, the dopants in the polysilicon, for example, have a significant impact on the reaction rate of Ni with silicon. For example, in a PMOS transistor 1, a p-type dopant such as B may be used wherein the silicide reaction rate is slower, whereas in the NMOS transistor 20, an n-type dopant such as As, Sb, or P may be used, wherein the silicide reaction rate is fast. In addition, the PMOS reaction front 18 is smoother in the slower formation, while the NMOS reaction front 22 is rougher in the faster formation. The inventors of the present invention expect that a combination of the grain structure of the polysilicon combined with the segregation of the NMOS dopants at the grain boundaries is responsible for these non-uniform reaction rate effects.

These problems make it difficult to control the silicidation process for FUSI (fully silicided gate), and can result in NiSi punch-through 24 of the gate oxide 13, and/or incomplete polysilicon silicidation 22. Thus, the two step silicidation method of the present invention provides a solution to these problems, providing more control of the gate poly silicidation for a smoother FUSI/poly interface. Also, with a smoother FUSI lower interface 18, there is less chance of the Ni diffusing or punching through 24 the gate oxide 13 or an incomplete FUSI formation 22 of the polysilicon 3.

The inventors of the present invention believe that the two step silicidation process achieves a smoother and more evenly matched formation between the NMOS and PMOS transistor types, for example, and also aids in the adjustment and balancing of the work functions by providing a nickel-rich poly gate for the PMOS device earlier in the FUSI formation process.

In one embodiment of the present invention, an etch-stop layer such as an oxide and a nitride hardmask layer are formed over a top portion of the gates of an NMOS and PMOS transistor of a CMOS device. A blocking layer such as an oxide or TEOS layer is then formed over the etch-stop layer. A chemical-mechanical polishing (CMP) or another such planarization is then performed down to land on the nitride of the etch-stop layer and then the device is post CMP cleaned. A dry nitride etch is then used to expose the top of the gates and a post etch clean is performed.

A first thickness silicide metal (e.g., Ni, Ti, Co, Pt, W) layer is then formed (sputtered, deposited) over the exposed NMOS and PMOS gates. A resist is then formed over the silicide metal and openings are patterned over the NMOS gates. The silicide metal is then etched to expose the fop of the NMOS gates, and the device is post etch cleaned. A preannealing (e.g., a rapid thermal process or RTP) is then used to cause the silicide metal to diffuse down into the polysilicon gates of the PMOS devices in a first silicide formation. The unreacted metal is then striped from the PMOS devices.

A second thickness silicide metal (e.g., Ni, Ti, Co, Pt, W) layer is then again deposited, such as by sputtering, over the exposed polysilicon of the gates. A second preannealing (e.g., RTP) is then again used to cause the second thicker layer of silicide metal to diffuse down into the polysilicon gates of both the NMOS and PMOS devices in a second silicide formation. The unreacted metal is then striped from the NMOS and PMOS devices, and the devices are annealed to fully form the more stable silicide alloy phase of the FUSI gates.

Subsequently, and optionally, any remaining oxide may be removed including any TEOS from the top of the nitride on the moat areas, for example, using a hydrofluoric acid (HF) rinse, and a dry etch to remove the nitride from the moat areas prior to a formation of an S/D silicide. Accordingly, the method of the present invention allows the gate silicide to be formed to the same extent more closely in both NMOS and PMOS areas of the same device.

FIGS. 2A-2D, for example, illustrate one or more exemplary methodologies for balancing the formation of an exemplary FUSI gate in both NMOS and PMOS transistors of the same MOS device according to one or more aspects of the present invention.

Figure 3A:
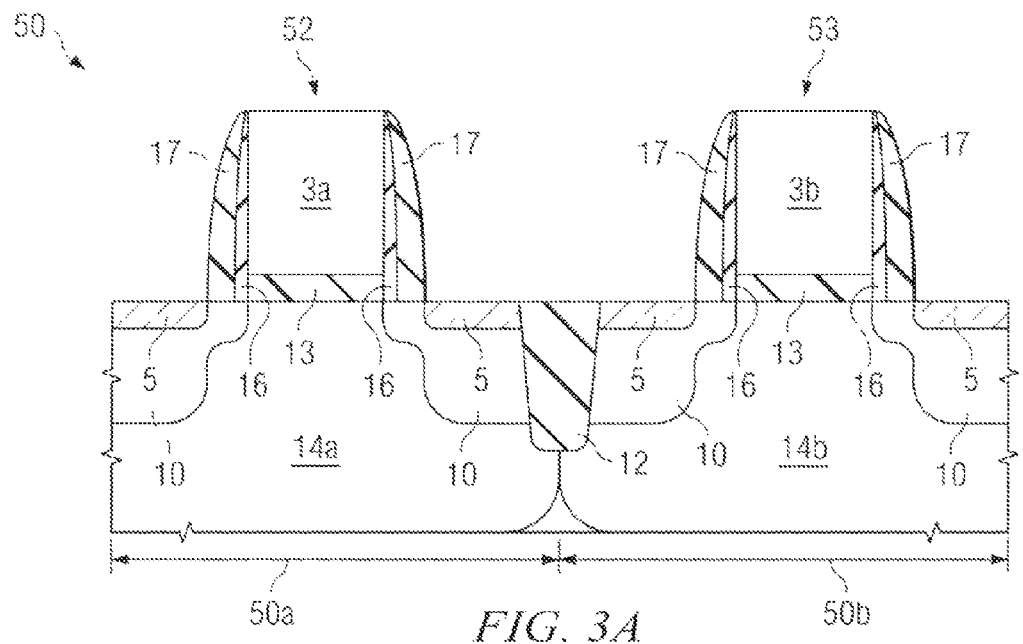
FIGS. 3A-3N are fragmentary cross sectional diagrams illustrating the formation of an exemplary FUSI gate transistor in both NMOS and PMOS transistors of a device according to one or more aspects of the present invention, such as by the methodologies set forth in FIGS. 2A-2E.
Figure 3B:
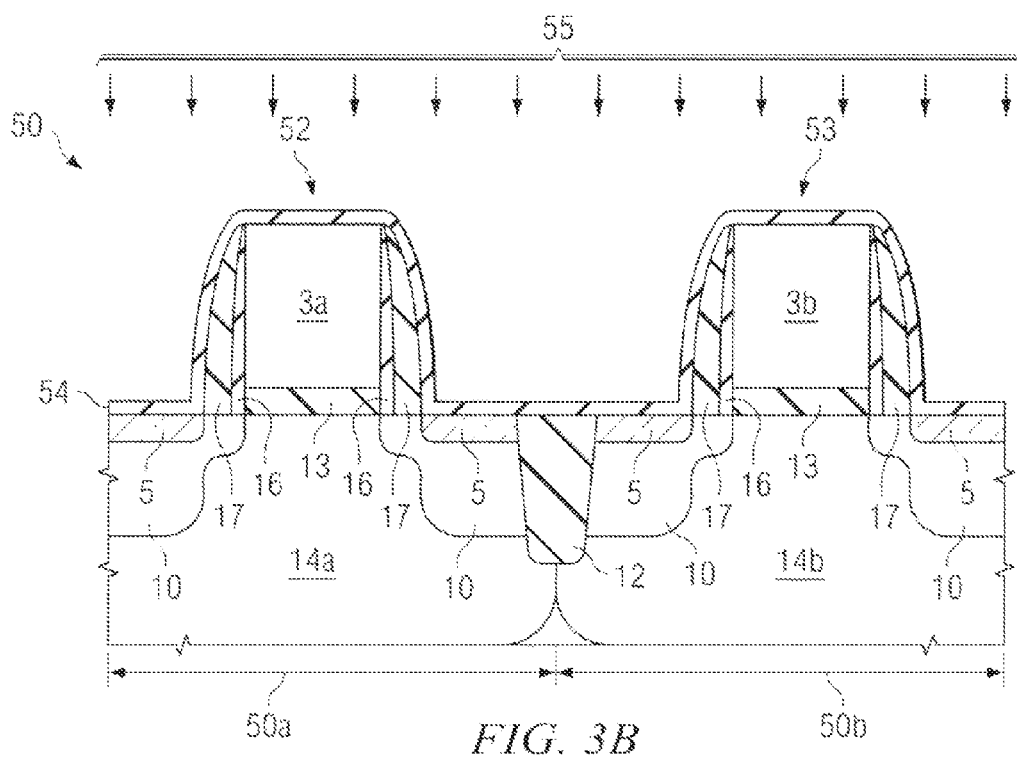
Figure 3C:
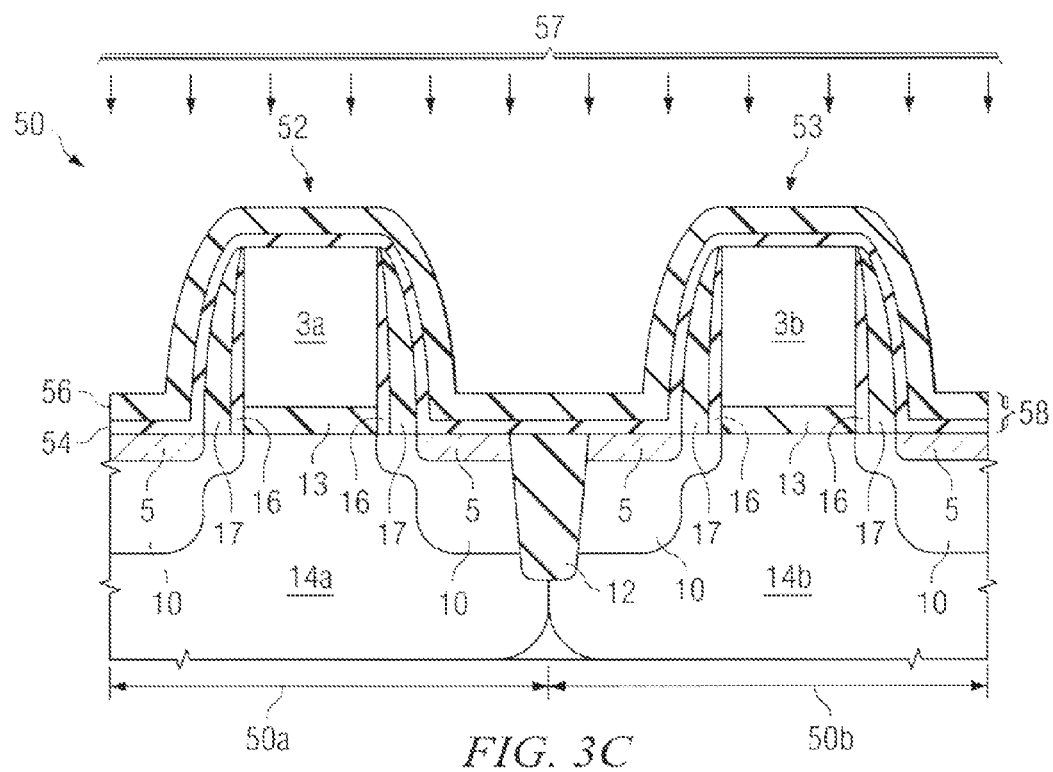
Figure 3D:
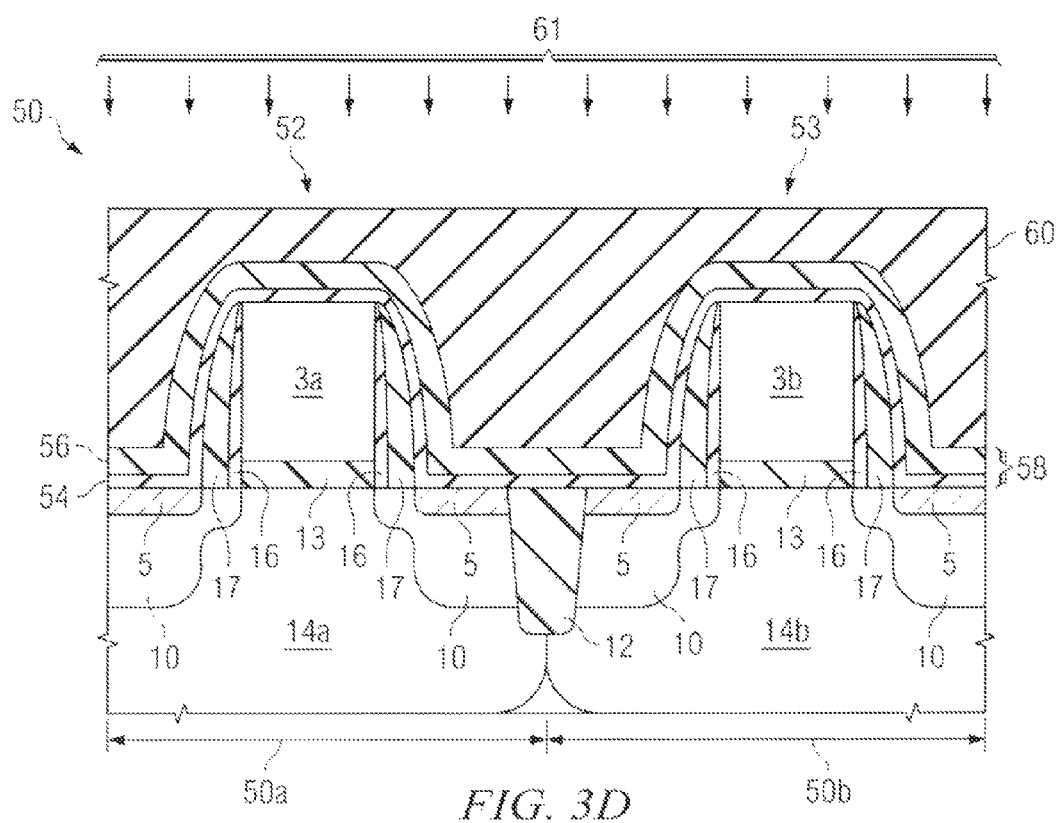
Figure 3E:
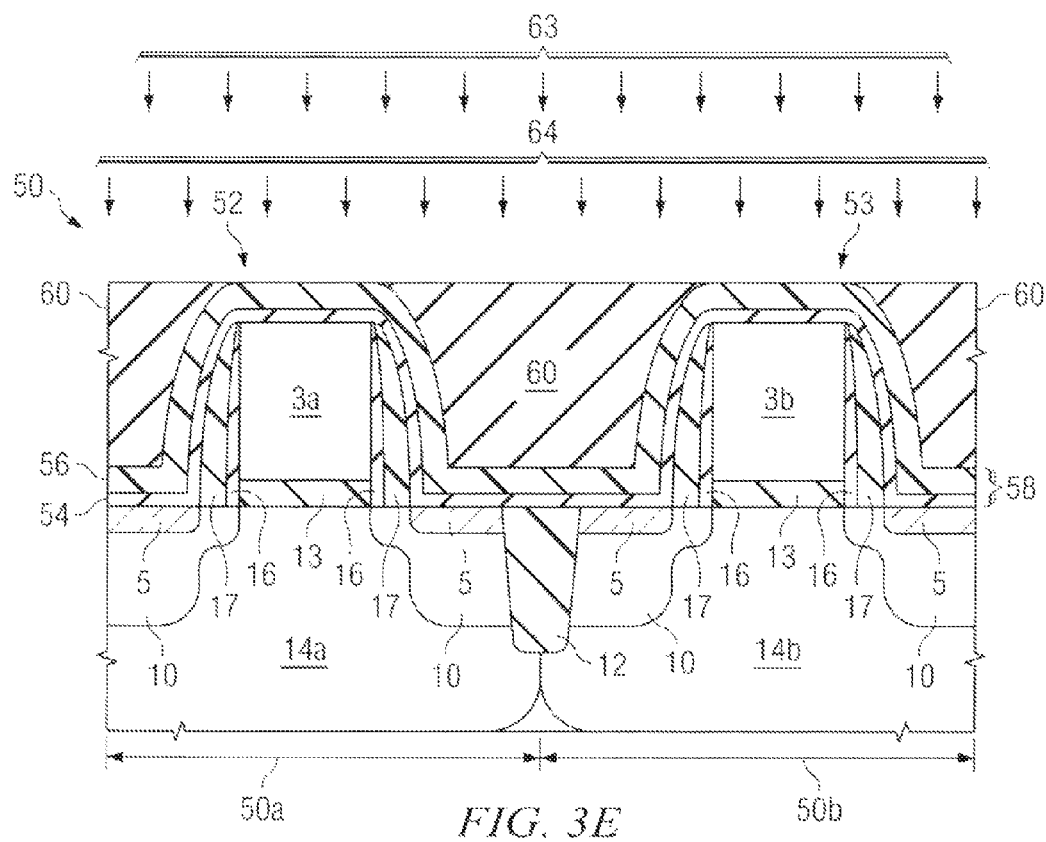
Figure 3F:
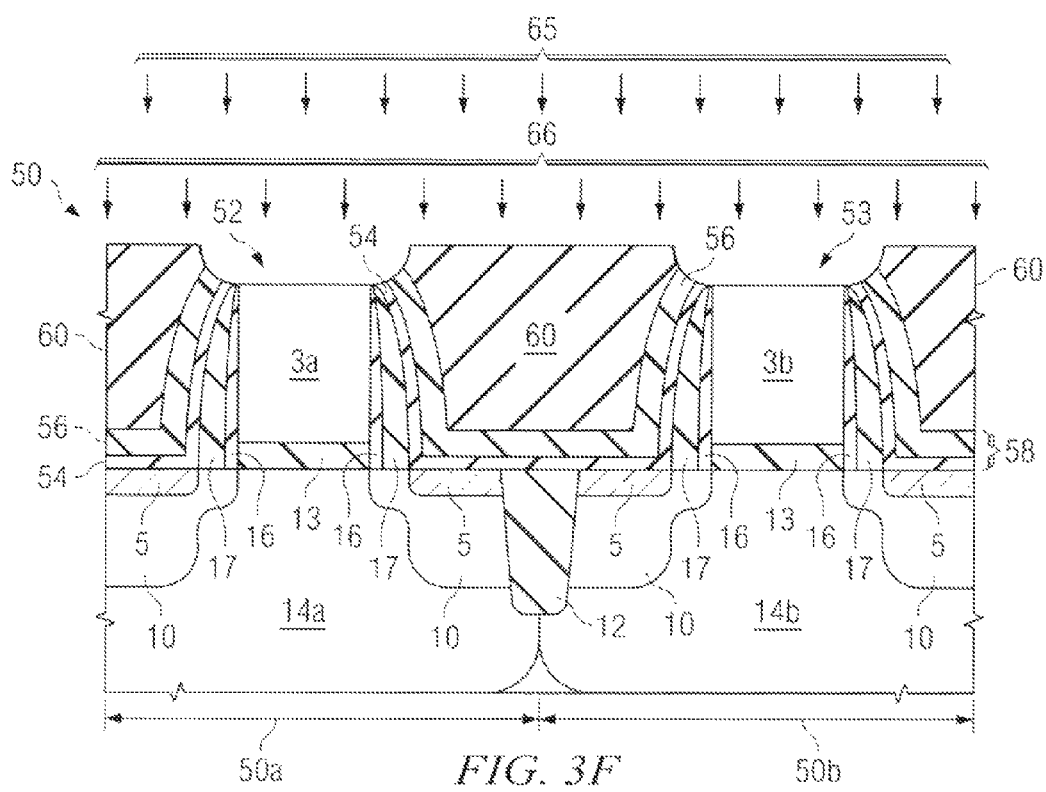
Figure 3G:
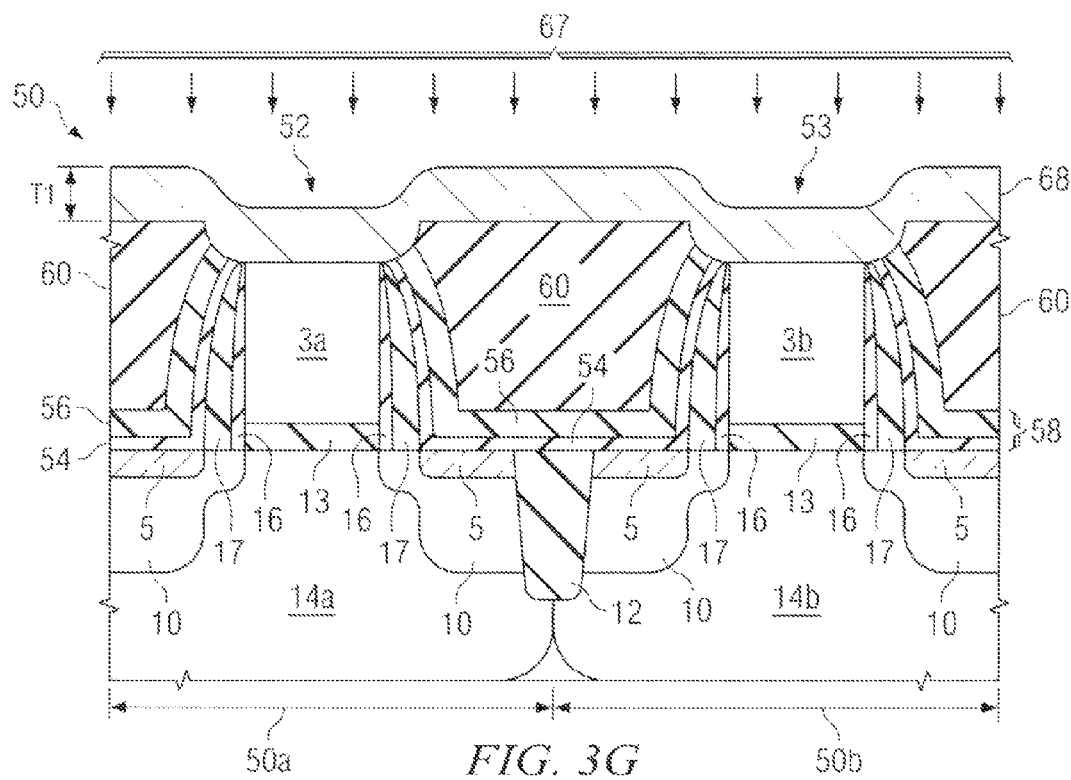
Figure 3H:
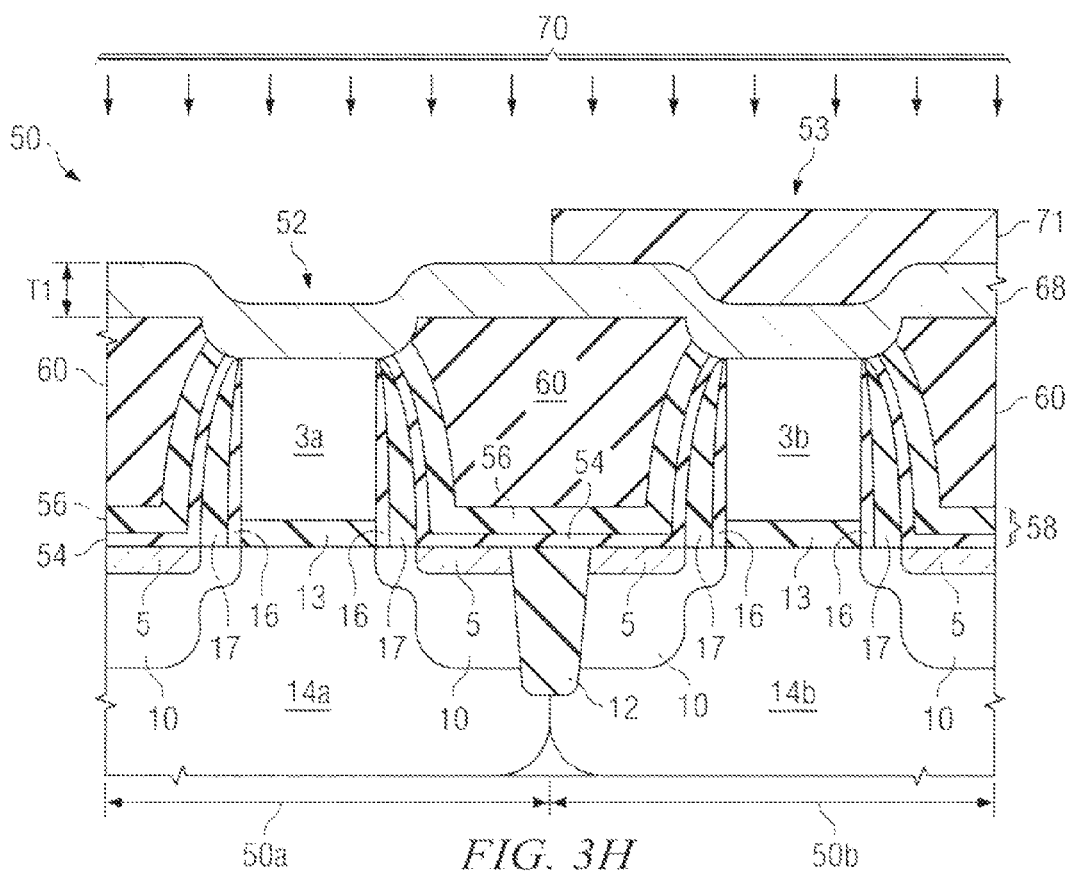
Figure 3I:
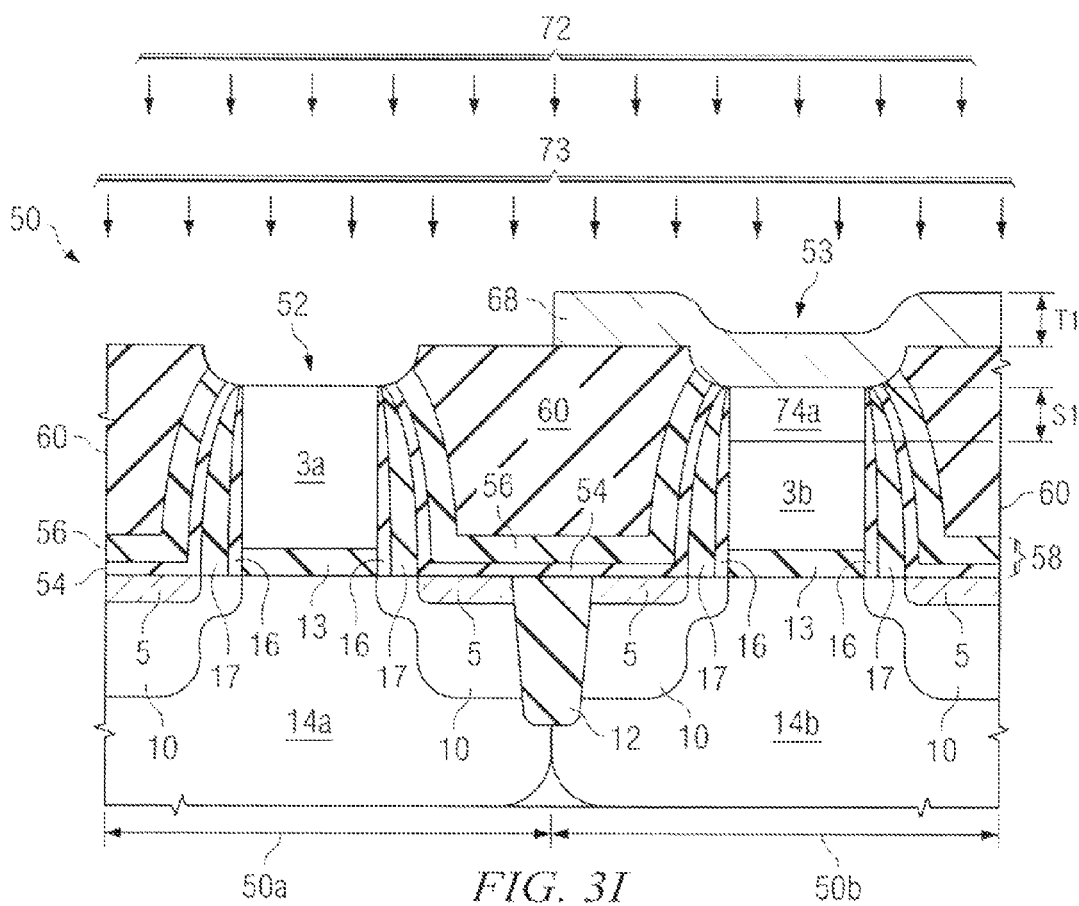
Figure 3J:
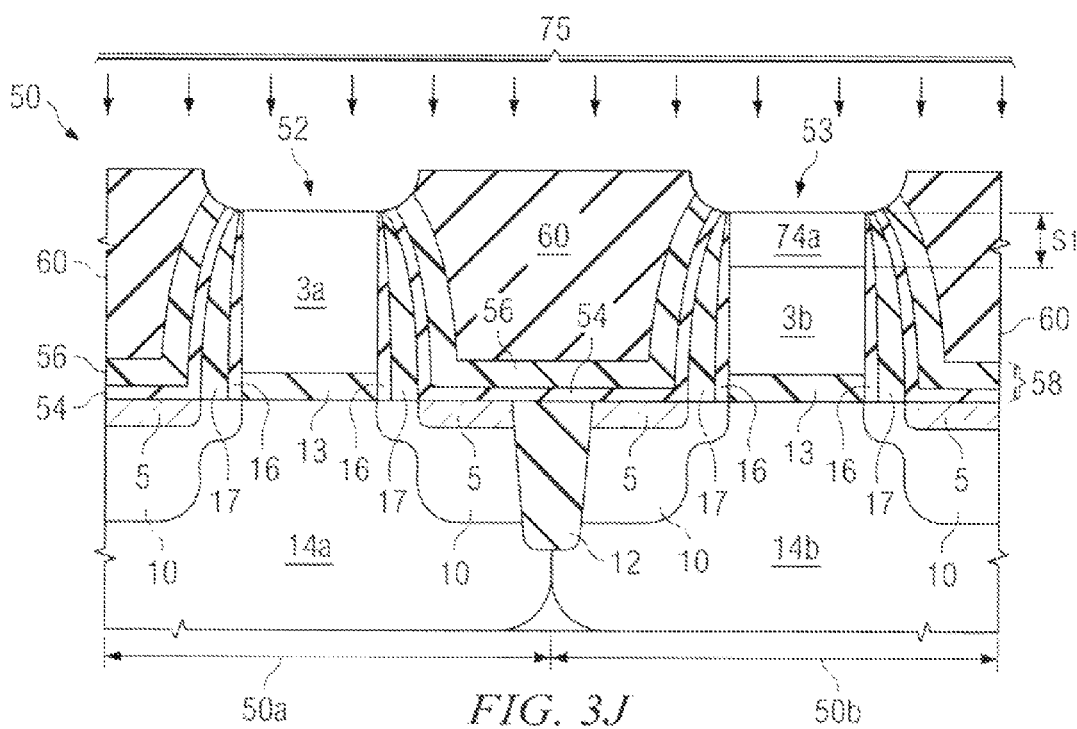
Figure 3K:
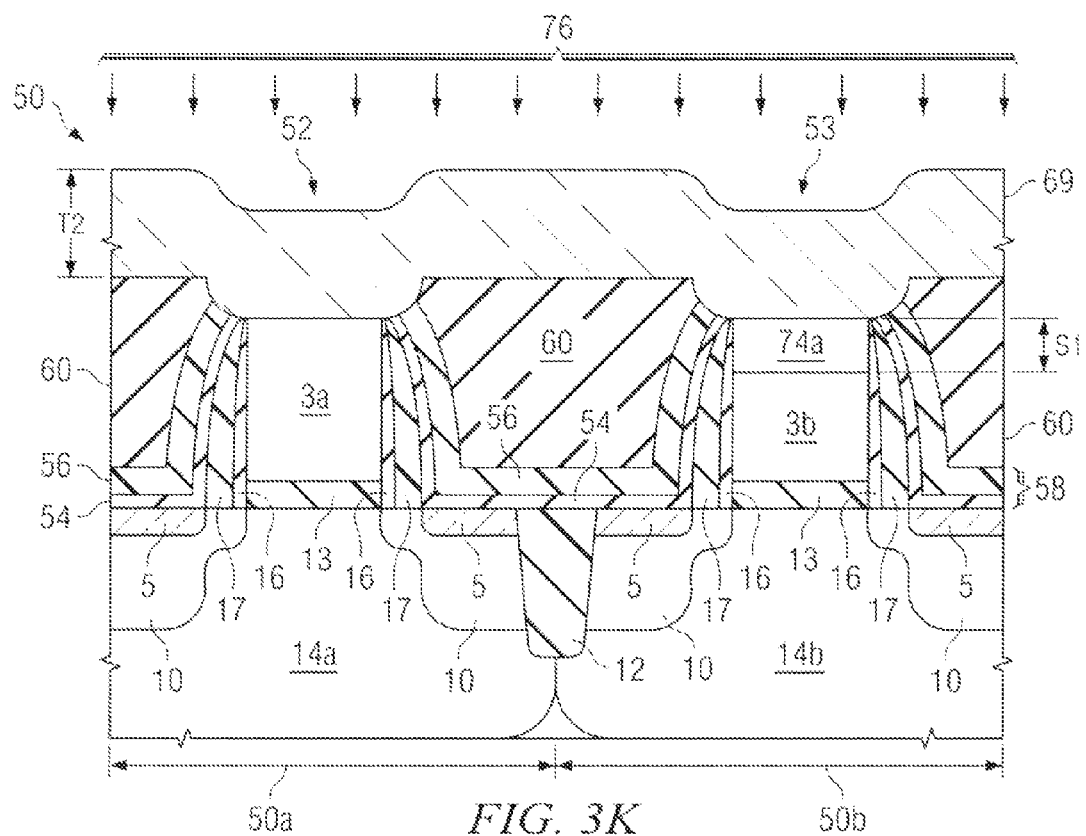
Figure 3L:
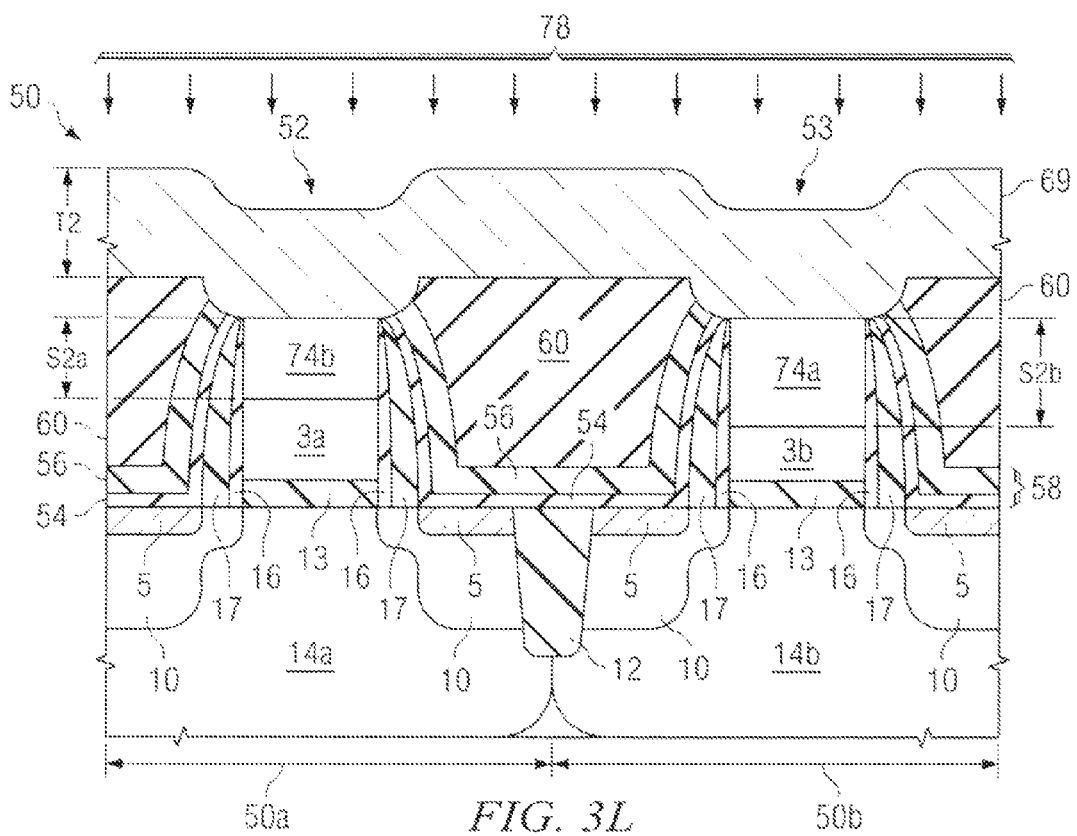
Figure 3M:
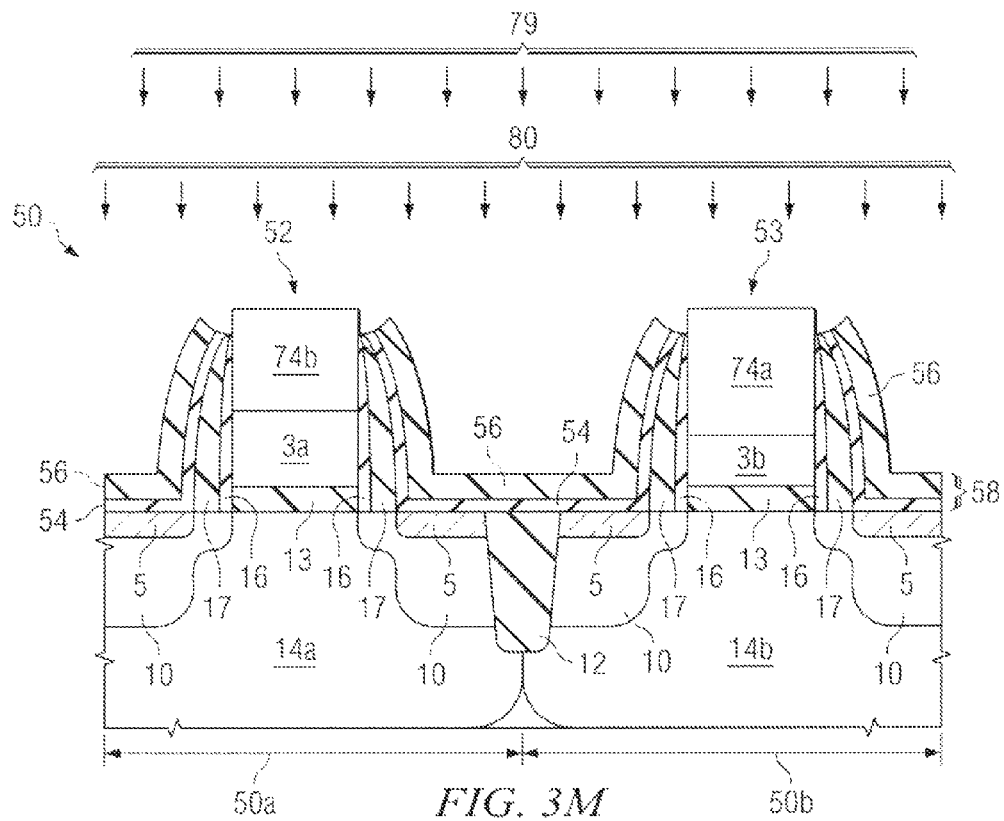
Figure 3N:
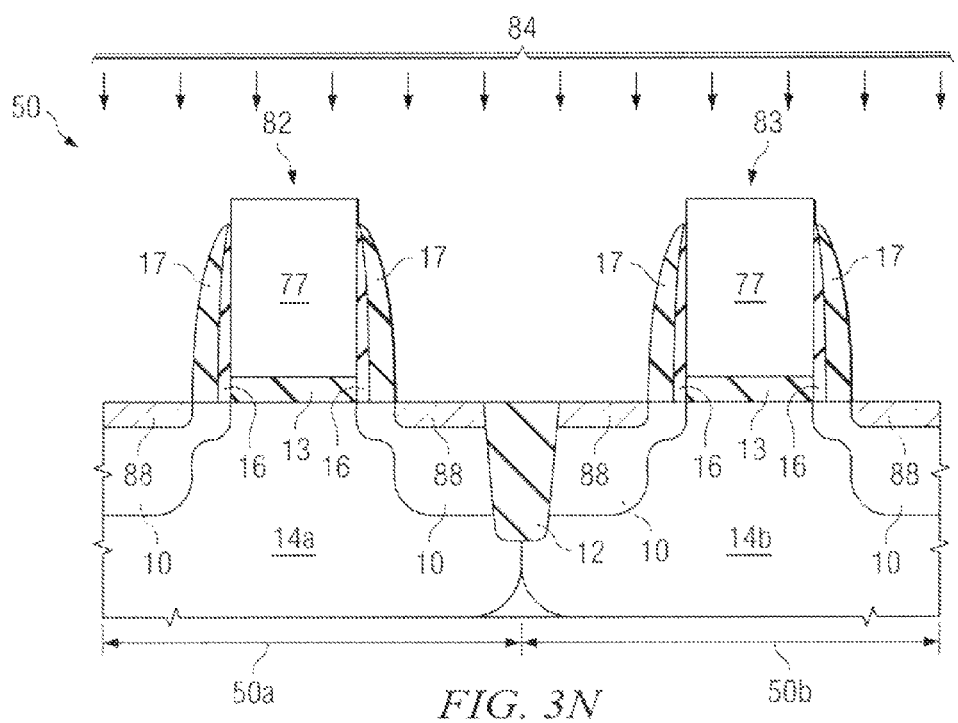

In FIG. 2A, an exemplary methodology 100 is illustrated for forming both NMOS 52 and PMOS 53 FUSI gate transistors according to one or more aspects of the present invention, for example, as in the fabrication steps of a MOS device 50 of FIGS. 3A-3N. As with all methodologies discussed herein, although the methodology 100 is illustrated and described hereinafter as a of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases. It will be appreciated that a methodology carried out according to one or more aspects of the present invention may be implemented in association with the formation and/or processing of structures illustrated and described herein as well as in association with other structures not illustrated or described herein.

The methodology 100 begins at 102, wherein an NMOS transistor 52 and a PMOS transistor 53 of a MOS device 50 is initially formed or otherwise provided (FIG. 3A), wherein the method will be carried-out. For example, in FIG. 3A, the NMOS transistor 52 is formed in a p-well 14a in an NMOS region 50a, while PMOS transistor 53 is formed in an n-well 14b in a PMOS region 50b of MOS device 50, wherein the p-well 14a separated from n-well 14b by a shallow trench isolation structure STI 12. NMOS transistor 52 and PMOS transistor 53 each comprise a source/drain regions 10 formed in the respective p-well 14a of the N-type transistor 52 or the n-well 14b of the P-type transistor 53. The gates of the transistors comprise a polysilicon gate material that has been doped according to a desired work function to form an n-type polysilicon gate material 3a and a p-type polysilicon gate material 3b, the gates materials 3a/3b overlying a gate oxide GOX 13. Offset spacers 16 and sidewall spacers 17 are formed on lateral sidewalls of the gate structures 52/53 for guiding the formation of the source/drain region structures 10 and other associated implantations, for example.

Optionally at 105 of FIG. 2B, an initial thin oxide or pad oxide layer 54 (FIG. 3B) may be formed 55 (e.g., by deposition or oxidation) over the NMOS transistor 52 and the PMOS transistor 53 of the single MOS device 50. Also at 105, a thin nitride or nitride hardmask layer 56 (FIG. 3C) is formed 57 (e.g., by a selective deposition of the nitride 56 of FIG. 3C) over the NMOS transistor 52 and the PMOS transistor 53 of the single MOS device 50. The pad oxide layer 54 and the nitride hardmask layer 56 also collectively form what may be known as a pre-metal dielectric (PMD) etch stop layer or simply an etch-stop layer 58 of FIG. 3C.

Also optionally at 106, a blocking layer such as an oxide or TEOS blocking layer 60 of FIG. 3D is then formed 61 (e.g., by oxidation or deposition) over the etch-stop layer 58, for example, over the nitride hardmask layer 56 of the etch-stop layer 58 of FIG. 3D.

Also optionally at 107, a planarization or chemical-mechanical polishing (CMP) 63 (FIG. 3E) is performed on the device 50, polishing 63 down to land on the nitride 56 of the etch-stop layer 58 over the gates of the NMOS and PMOS transistors 52/53, and then the device 50 is post CMP cleaned 64 (FIG. 3E).

Also optionally at 108, the fop of the nitride 56 is then removed 65, for example, by a dry nitride etch 65 of FIG. 3F to expose the top of the gates 52/53 of the device 50, and a post etch clean 66 is performed.

It will be appreciated by those skilled in the art that the selective nurture of the dry nitride etch 65 may be adjusted to remove various proportions of the nitride hardmask 56 and the pad oxide 54 and/or the TEOS blocking layer 60 to expose or protect a top portion of the gates 52/53 to a desired level, for example.

Returning to FIG. 2A, at 110, a first thickness "T1" of FIG. 3G (e.g., 200-300 Angstroms thick) of a silicide metal (e.g., Ni, Ti, Co, Pt, W) layer 68 is formed (e.g., sputtered, deposited) 67 over the exposed NMOS and PMOS polysilicon transistor gates 52 and 53 of FIG. 3G, respectively, for example, in preparation for a subsequent FUSI gate silicidation process, wherein the polysilicon gate materials 3a/3b of the gates 52/53, respectively, will be transformed into an amorphous silicon state.

At 120 of FIG. 2A, a resist 71 is then formed 70, as in FIG. 3H, over the silicide metal layer 68, and openings are patterned over the NMOS gates 52.

At 130 of FIG. 2A, the silicide metal layer 68 is then etched (e.g., wet or dry etch) 72, as shown in FIG. 3I, to expose the top of the NMOS gates 52, and the device 50 is post etch cleaned 72. This leaves the silicide metal layer 68 in tact only over the top of the PMOS gates 53.

At 140 of FIG. 2A, a preannealing, for example, using a rapid thermal process (RTP) 73 is performed, such as by heating to around 400 to 450 degrees Celsius for about 1 to 30 seconds, as shown in FIG. 3I. The preannealing or RTP allows the silicide metal 68 (e.g., Ni, Ti, Co, Pt, W) to diffuse down into the PMOS polysilicon gates 53 in a first silicide 74a formation of the device 50. At this point, however, the silicide metal such as nickel is essentially only mixed in with the polysilicon, to a first silicide depth "S1" of about ⅓ the thickness of the original PMOS gate layer 3b. Subsequently, however, in a final annealing process at step 180, the first silicide mixture 74a will be formed into a stable silicide alloy 77 as shown in FIG. 3N.

Returning to method 100 of FIG. 2A, at 150, the unreacted metal 68 of the silicide metal layer 68 is then striped 75 from the polysilicon gates of the PMOS devices 53, as shown in FIG. 3J.

At 160 of FIG. 2A, a second thickness "T2" (e.g., 800-1000 Angstroms thick) of a silicide metal layer (e.g., Ni, Ti, Co, Pt, W) 69 is then deposited 76, such as by sputtering, over the exposed polysilicon of the gates 52/53, as shown in FIG. 3K. It will be appreciated, that the second thickness "T2" of silicide metal 69, may be the same silicide metal as was used in the first silicide 74a formation, or may be another different silicide metal (e.g., Ni, Ti, Co, Pt, W) 69.

At 170 of FIG. 2A, a second preannealing, (e.g., an RTP) 78 is performed, such as by heating to around 400 to 450 degrees Celsius for about 1 to 30 seconds, to cause the second thickness "T2" layer of silicide metal 69 to diffuse down info the polysilicon gates 52/53 of both the NMOS and PMOS devices in a second silicide 74b and 74a formation, respectively, of device 50, as shown in FIG. 3L. In particular, because the NMOS gate material 3a tends to support a faster silicide formation than the PMOS gate material 3b, the second silicide 74b of the NMOS gate 52 forms to second silicide depth "S2a" of about ½ the thickness of the original NMOS gate layer 3a, while the second silicide 74a of the PMOS gate 53 only grows about an additional ⅓ depth to a second silicide depth "S2b" of about ⅔ the thickness of the original PMOS gate layer 3b, for example. It will be appreciated that the second thickness silicide metal layer 69, and the first and second preannealing time/temperatures may be adjusted to achieve a desired second silicide depth S2a/S2b in both the NMOS and PMOS gates, respectively, and a corresponding final FUSI depth subsequent to the final annealing of step 180.

At 180 of FIG. 2A, the unreacted metal 69 is then striped 79 from the NMOS devices 52 and PMOS devices 53, as shown in FIG. 3M. Also at 180, the device 50 is annealed 84, as shown in FIG. 3N to reform the silicide alloy (e.g., an $Ni_2Si$ alloy) into a more stable phase of the silicide alloy, for example, from an $Ni_2Si$ alloy into a more stable NiSi alloy phase 77 of the fully silicided FUSI gates, for example, NMOS FUSI gate 82 and PMOS FUSI gate 83. It may be noted comparing FIGS. 3M and 3N, that the final annealing 84 process which is accomplished, for example, by heating to around 500 to 750 degrees Celsius for about 10 seconds to about 2 minutes, permits the NMOS silicide 74b to further diffuse from a depth of about ½ the total depth of the gate polysilicon 3a to substantially the full depth of the NMOS FUSI gate 77, and permits the PMOS silicide 74a to further diffuse from a depth of about $⅔^{rd}$ the total depth of the gate polysilicon 3b to substantially the full depth of the PMOS FUSI gate 77 as shown in FIG. 3N.

It will be appreciated that the first T1 and second T2 thicknesses of silicide metal layers 69 and 69, respectively, and/or the first and second preannealing time/temperatures may be adjusted to achieve a desired first silicide depth (S1) and second silicide depth (S2a/S2b) in both the NMOS and PMOS gates, respectively, and a corresponding final FUSI depth in both the NMOS and PMOS gates 82/83, respectively.

In one embodiment, the thickness of the second silicide is greater than the first silicide by an amount which compensates for a difference in the rates of silicide formation between the NMOS and PMOS devices, to provide a nearly equivalent FUSI depth in both the NMOS and PMOS gates 82/83, respectively. Accordingly, the method of the present invention provides a processing technique with less risk of gate oxide 13 punch-through.

Optionally at 185 of FIG. 2C, any remaining oxide 54 and the TEOS 60 from the top of the nitride 56 may be removed 80 (FIG. 3M) from the top and/or sides of the gate poly, for example, using a hydrofluoric acid (HF) rinse prior to the formation of a FUSI gates at step 180.

Also optionally at 190 of FIG. 2D, the remaining nitride 56 and oxide 54 from the moat areas of the device 50 may be removed 79/80 as illustrated in FIGS. 3M and 3N. For example, the nitride 56 may be removed 80 using a dry etch or wet etch such as with hot phosphoric acid, and the oxide 54 may be removed 80, thereafter, using a hydrofluoric acid (HP) rinse 80 prior to the formation of an S/D silicide 88 in the moat areas of the device 50.

Accordingly, the method of the present invention allows a FUSI gate silicide 77 to be formed more evenly matched in both NMOS and PMOS transistors 82/83 of the same device 50, for example. In addition, the gate silicide may be formed with greater stability and more completely with less risk of gate oxide punch-through. In other words, the desired silicide thickness may be obtained in a more controlled manner using the method of the present invention.

Although the present invention discusses and illustrates the first, silicide of the PMOS being formed (step 140) before the joint formation of the NMOS and PMOS second silicide formation (step 170), it will be appreciated that if the work function of the NMOS and PMOS gate structures 52/53, respectively, are adjusted such that the PMOS reacts faster to the FUSI formation than the NMOS, that the NMOS may be formed first in the first formation (step 140), before jointly forming the NMOS and PMOS in the second silicide formation (step 170) in accordance with the present invention.

It will be appreciated, in the context of the present invention that during the formation of the gate silicides, the gate silicide metal 68/69 may be added to the gate polysilicon 3a/3b, such as by a sputtering, deposition and/or implantation process 67, for example. The gate silicide metal reacts with the exposed gate polysilicon in the gates 52/53 to form a more stable phase of silicide alloy, for example from a $Ni_2Si$ alloy to a more stable NiSi silicide alloy 77 in the gates 82/83. The gate silicide metal is used to set or establish a particular work function in the gates 82/83. To establish a work function for a PMOS type transistor, for example, the gate silicide metal may comprise Co, Ni, Se, Rh, Pd, Te, Re, Ir, Pt and/or Au, for example, and may have a work function of between about 4.8 eV and about 6.0 eV, for example.

In another aspect of the present invention, the S/D and gate silicide metals may be formed from different species, the same species, or various combinations of metal species which provides the appropriate needed work functions. For example, a CoSi S/D silicide and a Ni gate silicide may be easily formed after using the method of the present invention to provide a more evenly matched silicide formation in the NMOS and PMOS gates.

Accordingly, one or more silicidation processes are performed at 180 wherein heat is applied (e.g., annealing) to form the fully silicided FUSI gates 82/83 (FIG. 3N) of the MOS device 50. It will be appreciated that, as with all silicidation (e.g., heating, annealing) processes described herein, this process can be performed in an inert ambient at a temperature of around 500 to 750 degrees Celsius for about 10 seconds to about 2 minutes, for example.

It will be appreciated that, according to one or more aspects of the present invention, the S/D silicide metal and gate silicide metal form stable alloys within the respective polysilicon areas during the silicidation process, for example, for forming one or more NMOS or PMOS type transistors/devices 50.

Although not illustrated, it will be appreciated that other aspects of the transistor fabrication can also be done after gate structures are provided or before the silicidation process is performed. These include doping the substrate to establish source and drain regions therein adjacent to the gate structures, thereby establishing respective channel regions under the gate structures between the source and drain regions, LDD, MDD, or other extension implants, appropriate dopant activation anneals for source-drain, LDD and MDD dopants, and left and right sidewall spacer formation along left and right lateral sidewalls of the respective gate structures. Further metallization, and/or other back-end processing can also be subsequently performed.

Additionally, it will also be appreciated that the polysilicon, as well as the gate dielectric material 13 can be patterned before the metals are provided and the silicidation process is performed, in this scenario, selective masking/patterning may need to be implemented to inhibit these, as well as other materials from being imparted into exposed source/drain regions 10 of either the p-well 14a of N-type gate 52 or the n-well of P-type gate 53, for example.

Further, forming FUSI gate transistors as described herein can be implemented in a CMOS fabrication process in an efficient and cost effective manner.

Accordingly forming transistors according to one or more aspects of the present invention allows different types of FUSI gate transistors having different respective work functions to be concurrently formed in a single fabrication process. Forming the different types of transistors allows their respective advantages to be taken advantage of to satisfy different circuit application requirements. The FUSI gate transistors also allow feature sizes, such as dielectric thicknesses, for example, to be reduced to facilitate device scaling and increase packing densities.

It will be appreciated that white reference is made throughout this document to exemplary structures in discussing aspects of methodologies described herein (e.g., those structures presented in FIGS. 3A-3N while discussing the methodology set forth in FIGS. 2A-2D, that those methodologies are not to be limited by the corresponding structures presented. Rather, the methodologies (and structures) are to be considered independent of one another and able to stand alone and be practiced without regard to any of the particular aspects depicted in the figures.

If is also to be appreciated that layers and/or elements depicted herein are illustrated with particular dimensions relative to one another (e.g., layer to layer dimensions and/or orientations) for purposes of simplicity and ease of understanding and that actual dimensions of the elements may differ substantially from that illustrated herein. Additionally, unless stated otherwise and/or specified to the contrary, any one or more of the layers set forth herein can be formed in any number of suitable ways, such as with spin-on techniques, sputtering techniques (e.g., magnetron and/or ion beam sputtering), (thermal) growth techniques and/or deposition techniques such as chemical vapor deposition (CVD), physical vapor deposition (PVD) and/or plasma enhanced chemical vapor deposition (PECVD), or atomic layer deposition (ALD), for example, and can be patterned in any suitable manner (unless specifically indicated otherwise), such as via etching and/or lithographic techniques, for example. Further, the term "exemplary" as used herein merely meant to mean an example, rather than the best.

Although one or more aspects of the invention has been shown and described with respect to one or more implementations, equivalent alterations and modifications will occur to others skilled in the art based upon a reading and understanding of this specification and the annexed drawings. The invention includes all such modifications and alterations and is limited only by the scope of the following claims. In addition, while a particular feature or aspect of the invention may have been disclosed with respect to only one of several implementations, such feature or aspect may be combined with one or more other features or aspects of the other implementations as may be desired and/or advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming an integrated circuit including NMOS and PMOS devices with silicided gate electrodes, comprising:
   forming a PMOS device and an NMOS device on a substrate; each of the PMOS and NMOS devices having a gate electrode;
   forming a first silicide in at least a top portion of the gate electrode of the PMOS device and not in the gate electrode of the NMOS device; and
   forming a second silicide in at least the top portion of the gate electrode of the PMOS device and concurrently in at least a top portion of the NMOS device;
   wherein the second silicide has a thickness that is greater than a corresponding thickness of the first silicide by an amount that is proportional to a difference in rates of silicide formation in the gate electrodes of the NMOS and PMOS devices.

2. The method of claim 1, further comprising, after performing the first and second silicides, conducting further processing to fully silicide the NMOS and PMOS device gate electrodes.

3. The method of claim 2, wherein the further processing comprises annealing by heating to around 500 to 750 degrees Celsius for about 10 seconds to about 2 minutes.

4. The method of claim 1, wherein forming the first silicide comprises forming a first nickel metal material layer about 200 to 300 Angstroms thick, and conducting a first anneal by heating to around 400 to 450 degrees Celsius for about 1 to 30 seconds.

5. The method of claim 4, wherein forming the second silicide comprises forming a second nickel metal material layer about 800 to 1000 Angstroms thick, and conducting a second anneal by heating to around 400 to 450 degrees Celsius for about 1 to 30 seconds.

6. The method of claim 5, wherein the second nickel metal material layer has a thickness that is greater than a corresponding thickness of the first nickel metal material layer.

7. The method of claim 6, wherein the second nickel metal material layer is about 2 to 4 times thicker than the first nickel metal material layer.

8. The method of claim 1, wherein work functions of the NMOS and PMOS devices are set at least in part by adding different dopants prior to performing the first and second silicides.

9. The method of claim 1, wherein the first and second silicides comprise at least one of Ni, Co, Ti, Pt, or W.

10. The method of claim 9, wherein the first and second silicides comprise Ni.

11. The method of claim 1, wherein at least one of the first and second silicides is formed using a metal deposition comprising two or more metal depositions.

12. A method of forming an integrated circuit including NMOS and PMOS devices with silicided gate electrodes, comprising:
   forming a PMOS device and an NMOS device on a substrate; each of the PMOS and NMOS devices having a gate electrode;
   forming a first silicide in at least a top portion of the gate electrode of the PMOS device and not in the gate electrode of the NMOS device; and
   forming a second silicide in at least the top portion of the gate electrode of the PMOS device and concurrently in at least a top portion of the NMOS device;
   wherein the second silicide has a thickness that is greater than a corresponding thickness of the first silicide by an amount which compensates for a difference in rates of silicide formation in the gate electrodes of the NMOS and PMOS devices.

13. A method of forming an integrated circuit including NMOS and PMOS devices with silicided gates, comprising:
   forming a PMOS device and an NMOS device on a substrate; each of the PMOS and NMOS devices having a gate electrode;
   forming a first silicide metal layer on at least a top portion of the gate electrode of the PMOS device and not on the gate electrode of the NMOS device;
   conducting a first anneal to react the first silicide layer with the at least top portion of the gate electrode of the PMOS device to form a first silicide;
   removing an unreacted portion of the first silicide metal layer after conducting the first anneal;
   forming a second silicide metal layer on at least the top portion of the gate electrode of the PMOS device and concurrently on at least a top portion of the NMOS device;
   conducting a second anneal to react the second silicide metal layer concurrently with the at least top portions of the gate electrodes of the NMOS and PMOS devices to form a second silicide;
   removing an unreacted portion of the second silicide metal layer after conducting the second anneal; and
   conducting further processing to fully silicide the gate electrodes of the NMOS and PMOS devices;
   wherein the thickness of the second silicide metal layer is greater than the corresponding thickness of the first silicide metal layer by an amount that is proportional to a difference in rates of silicide formation in the gate electrodes of the NMOS and PMOS devices.

14. A method of forming an integrated circuit including NMOS and PMOS devices with silicided gates, comprising:
   forming a PMOS device and an NMOS device on a substrate; each of the PMOS and NMOS devices having a gate electrode;
   forming a first silicide metal layer on at least a top portion of the gate electrode of the PMOS device and not on the gate electrode of the NMOS device;

conducting a first anneal to react the first silicide layer with the at least top portion of the gate electrode of the PMOS device to form a first silicide;

removing an unreacted portion of the first silicide metal layer after conducting the first anneal;

forming a second silicide metal layer on at least the top portion of the gate electrode of the PMOS device and concurrently on at least a top portion of the NMOS device;

conducting a second anneal to react the second silicide metal layer concurrently with the at least top portions of the gate electrodes of the NMOS and PMOS devices to form a second silicide;

removing an unreacted portion of the second silicide metal layer after conducting the second anneal; and conducting further processing to fully silicide the gate electrodes of the NMOS and PMOS devices;

wherein the thickness of the second silicide metal layer is greater than the corresponding thickness of the first silicide metal layer by an amount which compensates for a difference in rates of silicide formation in the gate electrodes of the NMOS and PMOS devices.

15. A method of forming an integrated circuit including NMOS and PMOS devices with silicided gates, comprising:

forming a PMOS device and an NMOS device on a substrate; each of the PMOS and NMOS devices having a gate electrode;

forming an etch-stop layer over the gate electrodes of the NMOS and PMOS devices before forming a first silicide metal layer;

forming a blocking layer over the etch-stop layer;

planarizing the blocking layer down to the etch-stop layer over the gate electrodes of the NMOS and PMOS devices; and removing at least a portion of the etch-stop layer from at least a top portion of the gate electrode of at least one of the NMOS and PMOS devices;

forming the first silicide metal layer on at least the top portion of the gate electrode of the PMOS device and not on the gate electrode of the NMOS device;

conducting a first anneal to react the first silicide layer with the at least the top portion of the gate electrode of the PMOS device to form a first silicide;

removing an unreacted portion of the first silicide metal layer after conducting the first anneal;

forming a second silicide metal layer on at least the top portion of the gate electrode of the PMOS device and concurrently on at least the top portion of the NMOS device;

conducting a second anneal to react the second silicide metal layer concurrently with the at least the top portions of the gate electrodes of the NMOS and PMOS devices to form a second silicide;

removing an unreacted portion of the second silicide metal layer after conducting the second anneal; and conducting further processing to fully silicide the gate electrodes of the NMOS and PMOS devices.

16. The method of claim 15, further comprising removing a remaining part of the etch-stop layer from the top portion of the gate electrode of the at least one of the NMOS and PMOS devices; and removing the blocking layer from over the etch-stop layer.

17. The method of claim 15, further comprising removing a remaining part of the etch-stop layer from a moat area of at least one of the NMOS and PMOS devices; and forming a source/drain silicide in the moat area of the at least one of the NMOS and PMOS devices.

18. The method of claim 15, wherein the etch-stop comprises one of an oxide, a pad oxide, or a dielectric layer, and one of a nitride, a nitride hardmask, or a hardmask layer over the gate electrodes of the NMOS and PMOS devices.

19. The method of claim 15, wherein removing the at least a portion of the etch-stop layer comprises dry etching a nitride layer and a portion of an oxide layer to expose the top portions of the gate electrode of the at least one of the NMOS and PMOS devices.

20. The method of claim 15, further comprising conducting a post-etch cleaning after removing the portion of the etch-stop layer.

21. The method of claim 15, wherein the blocking layer comprises one of an oxide layer or a tetraethyl orthosilicate layer.

* * * * *